United States Patent
Horikawa et al.

(10) Patent No.: US 7,072,168 B2
(45) Date of Patent: Jul. 4, 2006

(54) CAPACITOR DEVICE AND METHOD OF MANUFACTURING THE SAME

(75) Inventors: Yasuyoshi Horikawa, Nagano (JP); Tomoo Yamasaki, Nagano (JP); Kiyoshi Ooi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 150 days.

(21) Appl. No.: 10/889,312

(22) Filed: Jul. 13, 2004

(65) Prior Publication Data

US 2005/0013088 A1 Jan. 20, 2005

(30) Foreign Application Priority Data

Jul. 14, 2003 (JP) .................................... 2003-196357

(51) Int. Cl.
*H01G 4/005* (2006.01)

(52) U.S. Cl. .................... 361/303; 361/306.3; 361/508; 361/528; 29/25.41; 29/25.03

(58) Field of Classification Search ............. 361/301.1, 361/303, 305, 306.1, 306.3, 329, 508–509, 361/528–529, 524; 29/25.41, 25.42, 25.03; 257/303, 306, 310, 532
See application file for complete search history.

(56) References Cited

U.S. PATENT DOCUMENTS

| | | | | |
|---|---|---|---|---|
| 4,816,894 A | * | 3/1989 | Hattori | 257/532 |
| 6,146,935 A | * | 11/2000 | Park et al. | 438/238 |
| 6,272,003 B1 | | 8/2001 | Schaper | |
| 6,507,497 B1 | | 1/2003 | Mashino | |

FOREIGN PATENT DOCUMENTS

JP          04-211191          8/1992

OTHER PUBLICATIONS

L. Schaper et al., The "Stealth" Decoupling Capacitor, 1997 Electronic Components and Technology Conference, pp. 724–729.

\* cited by examiner

*Primary Examiner*—Anthony Dinkins
(74) *Attorney, Agent, or Firm*—Armstrong, Kratz, Quintos, Hanson & Brooks, LLP (57) ABSTRACT

A capacitor device of the present invention includes a substrate, a float electrode formed on the substrate, a valve metal film formed on the float electrode, a dielectric film formed on the valve metal film by applying an anodic oxidation to a part of the valve metal film, and a pair of electrodes provided in areas overlapping with two different parts of the float electrode on the dielectric film respectively.

14 Claims, 10 Drawing Sheets

CAPACITOR DEVICE AND METHOD OF MANUFACTURING THE SAME

BACKGROUND OF THE INVENTION

1. Field of the Invention

The present invention relates to a capacitor device and a method of manufacturing the same and, more particularly, a capacitor device capable of being arranged on a circuit board on which high-speed electronic parts are packaged to stabilize a power supply voltage and also being applied as a decoupling capacitor to reduce a high-frequency noise, and a method of manufacturing the same.

2. Description of the Related Art

In the digital LSI including the microprocessor, reduction in the power supply voltage is being advanced in recent years by increasing a processing speed and reducing consumption of power. In such digital LSI, the power supply voltage of LSI is liable to become unstable whenever the power consumption of LSI is suddenly varied, and others. Also, in the high-speed digital LSI, it is required to prevent the malfunction of LSI caused by the high-frequency noise because the stable operation in the higher frequency (GHz) range is requested.

Therefore, for the purpose of stabilizing the power supply voltage and reducing the high-frequency noise, the decoupling capacitor is arranged between the power supply line of LSI and the ground line.

In the conventional circuit substrate having the decoupling capacitor, the capacitor is packaged in the near area on the circuit board, in which the LSI chip is packaged. In this case, because the lead wirings must be extended between the LSI chip and the capacitor, the relatively high inductance is present between these leads. As a result, the effect of suppressing the variation in the power supply voltage and reducing the high-frequency noise on the high-speed LSI is lessened even though the decoupling capacitor is provided.

Therefore, there was proposed the approach of reducing the inductance by arranging the decoupling capacitor just under the LSI chip to get the shortest wiring distance between the LSI chip and the capacitor. For example, in Patent Literature 1 (Patent Application Publication (KOKAI) Hei 4-211191) and Patent Literature 2 (Patent Application Publication (KOKAI) 2001-326305(U.S. Pat. No. 6,507,497 B2)), it is set forth that the wiring distance between the LSI chip and the capacitor is shortened by forming the build-in parallel-plate type capacitor on the circuit substrate and then mounting the LSI chip thereon to thereby reduce the inductance.

Figure 1A:
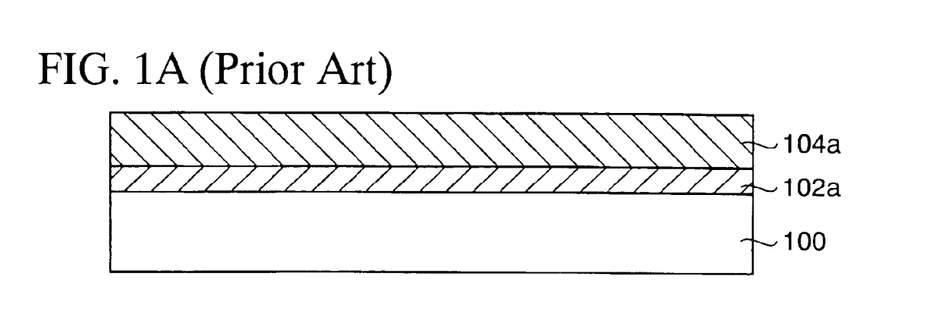
FIGS. 1A to 1E are sectional views showing a method of manufacturing a capacitor device in the related art.
Figure 1B:
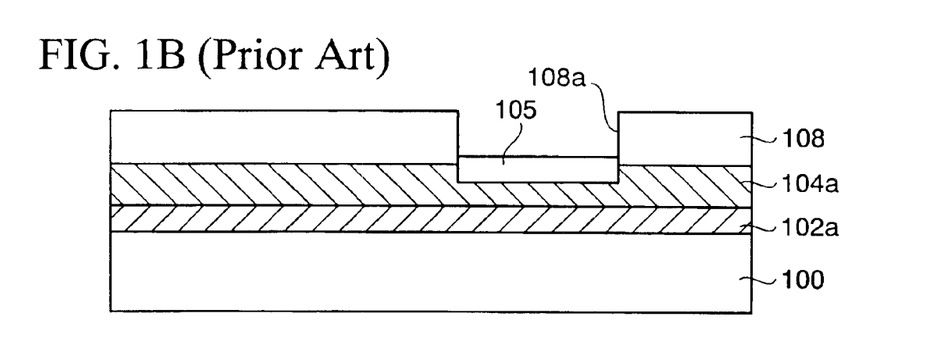

As the method of manufacturing the parallel-plate type capacitor in the related art, a variety of methods are employed. For instance, there is the method of employing the valve metal film (Ta film, Al film, or the like) that is subjected to the anodic oxidation as the dielectric film of the capacitor. FIGS. 1A to 1E and FIG. 2 are sectional views showing the method of forming the parallel-plate type capacitor based on the anodic oxidation process in the related art. As shown in FIG. 1A, first a first conductive film 102a serving as the lower electrode is formed on a substrate 100, and then a valve metal film 104a is formed on the first conductive film 102a. Then, as shown in FIG. 1B, a resist film 108 in which an opening portion 108a is provided in an area, to which the anodic oxidation of the valve metal film 104a is to be applied, is formed on the valve metal film 104a.

Figure 1C:
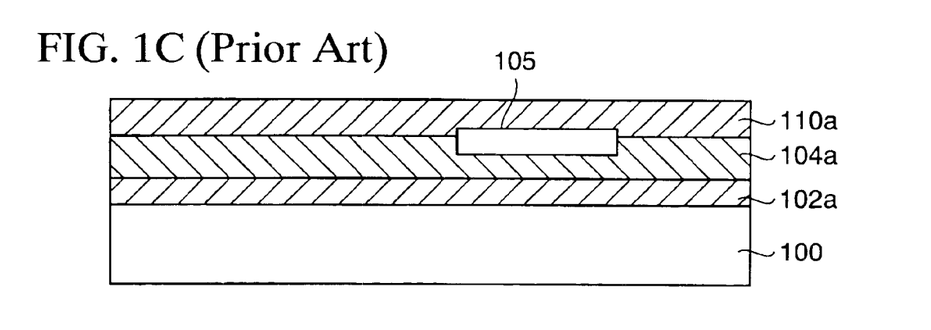

Then, a dielectric film 105 is formed by applying the anodic oxidation to the portion, which is exposed from the opening portion 108a in resist film 108, of the valve metal film 104a and then the resist film 108 is removed. Then, as shown in FIG. 1C, a second conductive film 110a serving as the upper electrode is formed on the dielectric film 105.

Figure 1D:
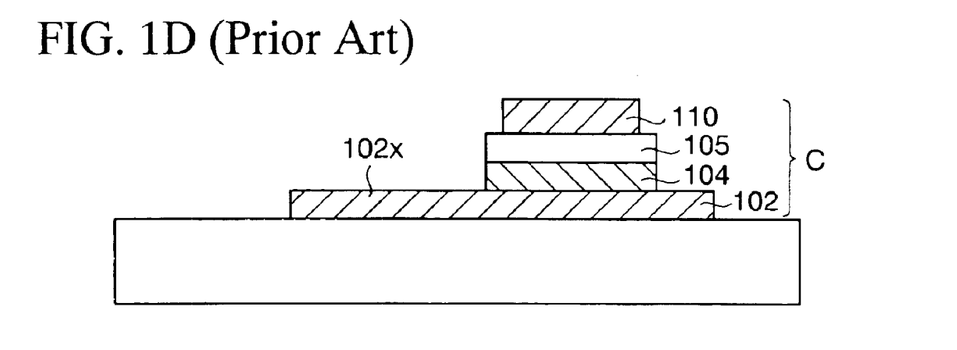

Then, as shown in FIG. 1D, an upper electrode 110 is formed by patterning the second conductive film 110a. Then, the portion of the valve metal film 104a, which is not covered with the dielectric film 105, is etched away, whereby a structure in which the dielectric film 105 is formed on a valve metal film pattern 104 is obtained. Then, a lower electrode 102 having an extended portion 102x extended from the valve metal film pattern 104 to the outside is formed by patterning the first conductive film 102a. Thus, a capacitor C having such a structure that the valve metal film pattern 104 and the overlying dielectric film 105 are put between the lower electrode 102 and the upper electrode 110 is obtained.

Figure 1E:
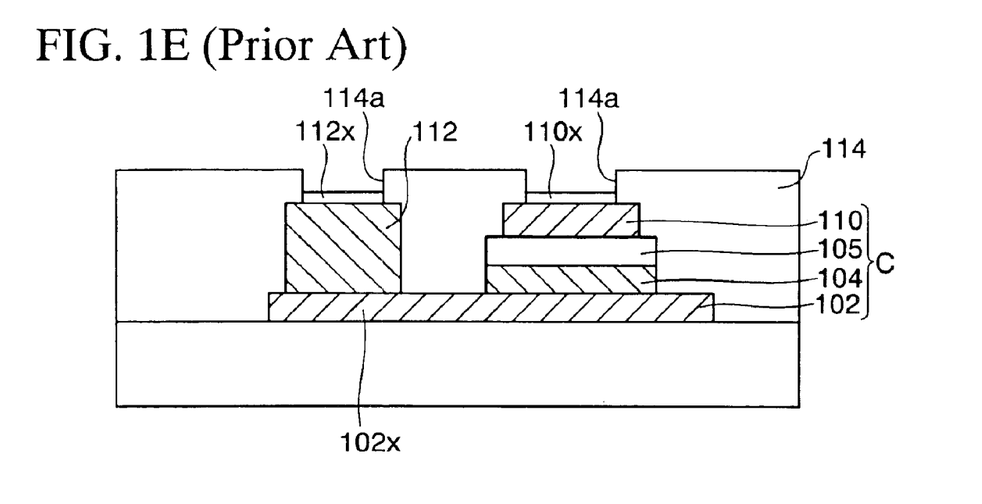

Then, as shown in FIG. 1E, a metal electrode 112 having a height that is equal to an upper surface of the upper electrode 110 is formed on the extended portion 102x of the lower electrode 102. Then, an insulating film 114 in which opening portions 114a are provided on the upper electrode 110 and the metal electrode 112 is formed. Then, an upper electrode connecting portion 110x and a lower electrode connecting portion 112x are formed by applying the Ni/Au plating to the upper electrode 110 and the metal electrode 112 in the opening portions 114a in the insulating film 114 respectively. The above metal electrode 112 is provided to make respective heights of the upper electrode connecting portion 110x and the lower electrode connecting portion 112x substantially uniform. As a result, the electronic parts, and the like can be connected to the upper electrode connecting portion 110x and the lower electrode connecting portion 112x via the bumps with good reliability.

The conventional capacitor C has the structure that the upper electrode connecting portion 110x is provided directly on the upper electrode 110 but the lower electrode connecting portion 112x is connected to the lower electrode 102 via the metal electrode 112 and the extended portion 102x of the lower electrode 102. In this manner, in the conventional capacitor C, the equivalent series inductance (ESL) is increased since the lead wiring must be extended from the lower electrode 102 to the lower electrode connecting portion 112x because of its structure, and as a result the high-frequency characteristic of the capacitor C is disturbed.

Figure 2:
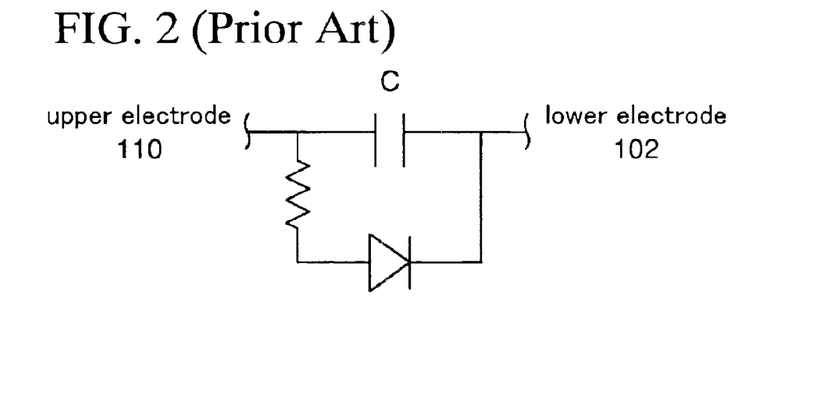
FIG. 2 is a circuit diagram showing an equivalent circuit of the capacitor in the related art.

Also, as shown in an equivalent circuit in FIG. 2, the conventional capacitor C using the dielectric film 105 formed by the anodic oxidation process (the electrolytic capacitor) exhibits the polarity such that the good electric insulation characteristic can be obtained whenever the lower electrode 102 side serves as the anode electrode, whereas the electric insulation characteristic cannot be obtained because of its rectifying action whenever conversely the upper electrode 110 side serves as the anode electrode. As a result, in the case where the voltage is applied opposite to the polarity of the capacitor C, in some case the large leakage current flows through the capacitor and in turn the dielectric film is broken down to cause the short circuit or the capacitor C is destroyed by the thermal stress caused by the current.

In Patent Literature 3 (U.S. Pat. No. 6,272,003 B1) and Non-Patent Literature 1 (1997 Electronic Component and Technology Conference p.724–729), the capacitor in which the nonpolar dielectric film formed by the sputter method, or the like is provided on the common floating gate and then two separated plate patterns are formed on the dielectric film is set forth, for the purpose of improving the high-frequency characteristic by reducing the inductance of the capacitor.

SUMMARY OF THE INVENTION

It is an object of the present invention to provide a capacitor device using a dielectric film formed by the anodic oxidation process, capable of realizing a good high-frequency characteristic by reducing an inductance and also realizing a good electric insulation characteristic even when a current is supplied in either direction, and a method of manufacturing the same.

The present invention is relevant to a capacitor device which comprises a substrate; a float electrode formed on or over the substrate; a valve metal film formed on the float electrode; a dielectric film formed on the valve metal film by applying an anodic oxidation to a part of the valve metal film; and a pair of electrodes provided in areas overlapping with two different parts of the float electrode on the dielectric film respectively.

As described above, in the conventional capacitor device using the dielectric film that is formed by applying the anodic oxidation to a part of the valve metal film, the electric characteristic is different dependent on which one of the upper electrode and the lower electrode is used as the anode because the dielectric film itself has the polarity.

In the present invention, the valve metal film and the dielectric film formed by the anodic oxidation are formed on the float electrode, and a pair of electrodes are provided in areas overlapping with two different portions of the float electrode on this dielectric film respectively. In other words, the first capacitor consists of the float electrode, the dielectric film formed on the valve metal film, and one electrode, and the second capacitor consists of the float electrode, the dielectric film formed on the valve metal film, and the other electrode. Then, the capacitor of the present invention is constructed by connecting the first capacitor and the second capacitor in series with each other.

For this reason, since the electrical route extended from one electrode to the other electrode and the electrical route extended conversely from the other electrode to one electrode become identical, the electrical characteristic can be obtained symmetrically in both directions. In addition, since the current supplying direction in either of the first and second capacitors is arranged in the direction opposite to the rectifying direction of the dielectric film even if either of a pair of electrodes is used as the anode, the good electric insulation characteristic can be obtained in both directions. In this manner, in the present invention, the capacitor device without the polarity can be realized although the dielectric film having the polarity is used.

Also, in the present invention, there is no necessity to extend the lower electrode via the wiring unlike the related art, a pair of electrodes are arranged on the dielectric film. Therefore, the wiring leading of the electrode can be suppressed to the lowest minimum. As a result, the equivalent series inductance (ESL) of the capacitor device can be reduced and the high-frequency characteristic of the capacitor can be improved.

In above mentioned Patent Literature 3 and Non-Patent Literature 1, it is not considered at all to get the symmetrical electric insulation characteristic in both directions in the capacitor device using the polar dielectric film formed by applying the anodic oxidation to the valve metal film. Therefore, these Literatures do not suggest the constitutions of the present invention at all.

DETAILED DESCRIPTION OF THE PREFERRED EMBODIMENTS

Embodiments of the present invention will be explained with reference to the drawings hereinafter.

First Embodiment

Figure 3A:
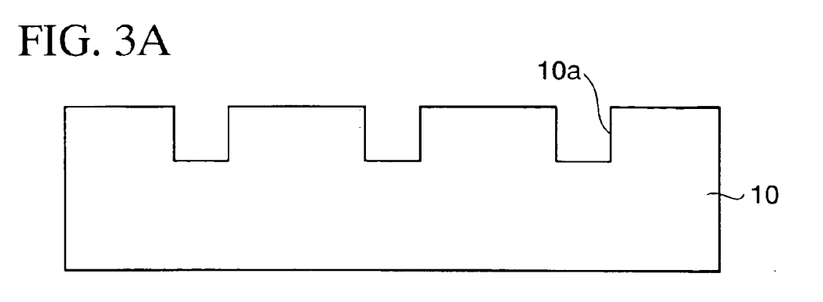
FIGS. 3A to 3J are sectional views showing a method of manufacturing a capacitor device according to a first embodiment of the present invention.

FIGS. 3A to 3J are sectional views showing a method of manufacturing a capacitor device according to a first embodiment of the present invention. As shown in FIG. 3A, first a silicon substrate 10 of about 700 μm thickness is prepared as an example of the substrate, and then holes 10a of about 50 μm depth, for example, are formed in predetermined portions of the silicon substrate 10. The holes 10a in the silicon substrate 10 are formed by RIE (Reactive Ion Etching), wet etching, laser, or the like.

Here, glass epoxy resin substrate, antiphotosensitive resin substrate such as LCP (Liquid Crystal Polymer), or the like, metal substrate, photosensitive glass substrate, or the like may be used in place of the silicon substrate 10. The holes are formed by the router or the drill in the case where the glass epoxy resin substrate is used. Also, the holes are formed by the etching in the case where the metal substrate or the glass substrate is used. In addition, the holes are formed by the skiver (scanning type laser) or the router in case the antiphotosensitive resin substrate such as LCP, or the like is used.

Figure 3B:
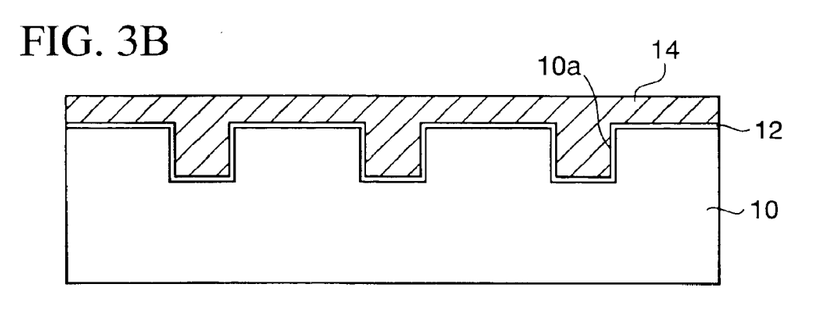

Then, as shown in FIG. 3B, a silicon oxide film 12 of about 1 to 3 μm thickness, for example, is formed on the silicon substrate 10 containing inner surfaces of the holes 10a by the thermal oxidation or the CVD.

Then, a first conductive film 14 is formed on the silicon oxide film 12 to fill the holes 10a in the silicon substrate 10. As the material of the first conductive film 14, a low-resistance metal such as copper (Cu), aluminum (Al), platinum (Pt), gold (Au), ruthenium (Ru), or the like is used. Also, as the method of forming the first conductive film 14, the plating, the sputter, the CVD, or the like is used.

Figure 3C:
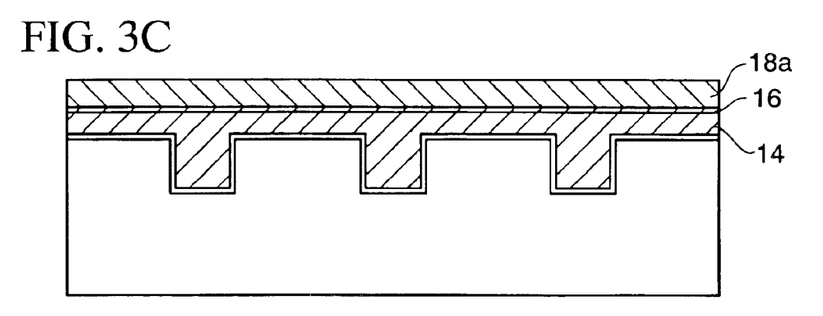

Then, as shown in FIG. 3C, a first intermediate layer 16 made of titanium (Ti), aluminum (Al), or the like is formed on the first conductive film 14. Then, a valve metal film 18a is formed on the first intermediate layer 16 by the sputter method, the CVD method, or the like. The valve metal film 18a denotes such a film that the oxide layer obtained by the anodic oxidation passes the current therethrough only in one direction but scarcely passes the current therethrough in the opposite direction, i.e., a film that has the so-called valve action. As such metal, there are tantalum (Ta), aluminum (Al), hafnium (Hf), niobium (Nb), titanium (Ti), zirconium (Zr), and the like.

Figure 3D:
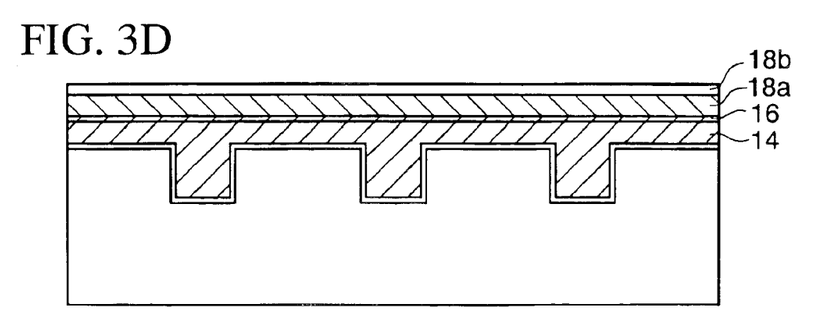

Then, as shown in FIG. 3D, a dielectric film 18b is formed on its surface layer portion by applying the anodic oxidation to the valve metal film 18a. For example, in the case where a Ta film is used as the valve metal film 18a, a 0.1% to several % sodium citrate solution is used as the electrolysis solution, and then a $Ta_2O_5$ film (dielectric film) is formed on the surface layer portion of the Ta film by dipping the silicon substrate 10 on which the Ta film is formed into the electrolysis solution and connecting the Ta film to the anode to supply a current to the Ta film. For instance, the current supplied to the Ta film is a constant current of 10 mA/cm² and the voltage is applied up to about 200 V as the forming voltage to oxidize the Ta film.

In this anodic-oxidizing step, the first intermediate layer 16 acts as the barrier layer to prevent the underlying first conductive film 14 (e.g., copper) from diffusing into the valve metal film 18a when the anodic oxidation is applied to the valve metal film 18a. Also, this first intermediate layer 16 acts as the adhesive layer to improve the adhesion between the first conductive film 14 and the valve metal film 18a.

Figure 3E:
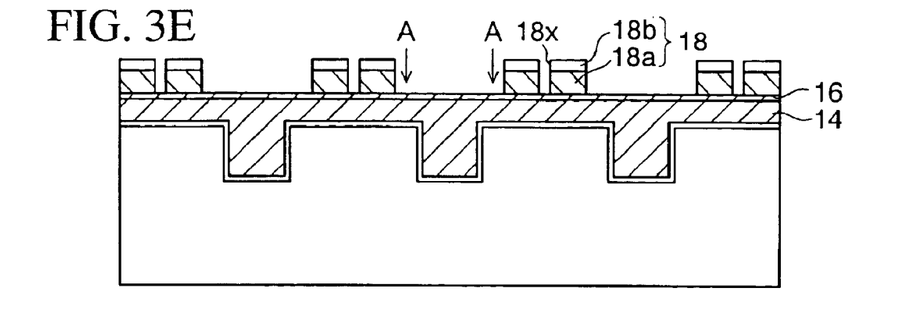

Then, as shown in FIG. 3E, the dielectric film 18b and the valve metal film 18a are patterned by the photolithography and the dry etching, etc. Thus, dielectric film/valve metal film patterns 18 in which an opening portion 18x is provided in the center portion respectively are formed. The dielectric film/valve metal film patterns 18 are formed as patterns on portions of the first intermediate layer 16, in which the hole 10a of the silicon substrate 10 is not formed. In this case, the opening portion 18x is not always provided in the dielectric film/valve metal film patterns 18.

Then, in order to separate the areas in which the first intermediate layer 16 and the first conductive film 14 are filled in the holes 10a from the areas in which the first intermediate layer 16 and the first conductive film 14 are formed just under the dielectric film/valve metal film patterns 18, the first intermediate layer 16 and the first conductive film 14 located in the areas indicated by A in FIG. 3E are removed by the photolithography and the dry etching.

Figure 3F:
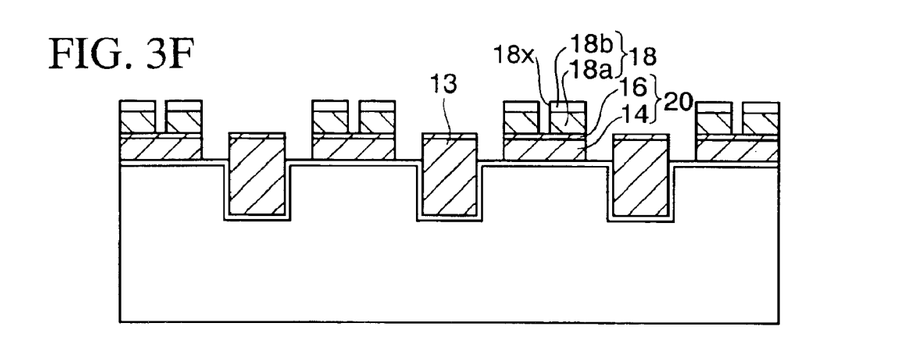

Thus, as shown in FIG. 3F, metal posts 13 that are filled in the holes 10a of the silicon substrate 10 to protrude upwardly are formed. At the same time, float electrodes 20 consisting of the first conductive film 14 and the first intermediate layer 16 are formed just under the dielectric film/valve metal film patterns 18.

Figure 3G:
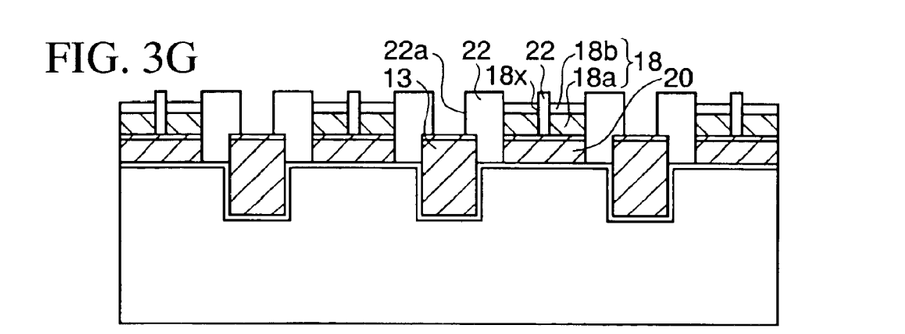

Then, as shown in FIG. 3G, an insulating film 22 is buried and formed selectively on areas between the metal posts 13 and the float electrodes 20 and in the opening portions 18x in the dielectric film/valve metal film patterns 18. Thus, the metal posts 13 and the dielectric film/valve metal film patterns 18 are isolated mutually in a state that respective areas between them are made flat, and also via holes 22a are arranged on the metal posts 13. The insulating film 22 is formed, for example, by coating a photosensitive resin such as a photosensitive epoxy resin, a photosensitive polyimide resin, or the like to make an upper surface of the resultant structure in FIG. 3F flat and then exposing/developing the photosensitive resin.

Figure 3H:
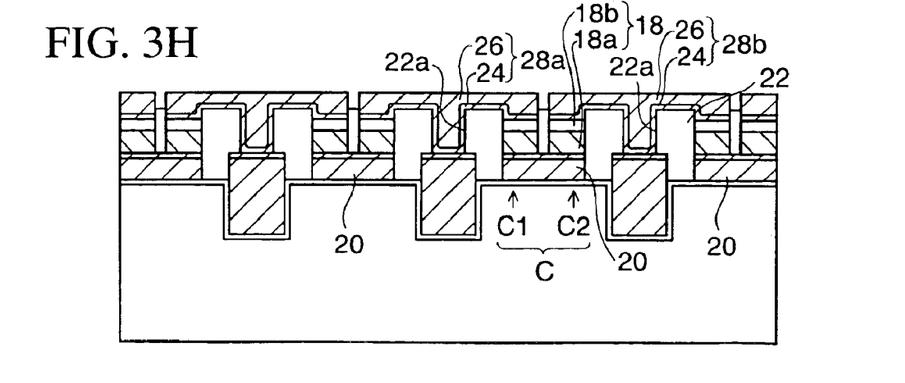

Then, as shown in FIG. 3H, a second intermediate layer 24 is formed by forming a Cr film (or a Ti film) and a Cu film in seriatim on an upper surface of the structure in FIG. 3G by means of the plating, the sputter, the CVD, or the like. Then, a second conductive film 26 made of Cu or the like is formed on the second intermediate layer 24 to have a film thickness that fills the via holes 22a. The second intermediate layer 24 is provided to improve the adhesion between the dielectric film 18b and the second conductive film 26.

Then, the second conductive film 26 and the second intermediate layer 24 are patterned by the photolithography and the etching. Thus, a pair of electrodes (a first electrode 28a and a second electrode 28b) connected to the metal posts 13 via the via holes 22a are formed on the dielectric film 18b and the insulating film 22.

At this time, the first electrode 28a out of a pair of electrodes 28a, 28b is formed to extend from an area overlapping with one part of the float electrode 20 to an area overlapping with one part of an adjacent float electrode 20 that is adjacent in one direction. Also, the second electrode 28b is formed to extend from an area overlapping with the other part of the float electrode 20 to an area overlapping with one part of another adjacent float electrode 20 that is adjacent in the opposite direction. It is preferable that a pair of electrodes 28a, 28b should be arranged symmetrically with respect to the center portion of the float electrode 20 respectively.

In this case, a pair of electrodes 28a, 28b may be formed by using the semi-additive process, the full additive process, or the like.

In this fashion, the capacitor C having the structure in which the dielectric film 18b formed on the valve metal film 18a is put between the float electrode 20 and a pair of electrodes 28a, 28b is obtained. This capacitor C is constructed by connecting in series a first capacitor C1 consisting of the float electrode 20, the dielectric film 18b, and the first electrode 28a and a second capacitor C2 consisting of the float electrode 20, the dielectric film 18b, and the second electrode 28b.

Figure 3I:
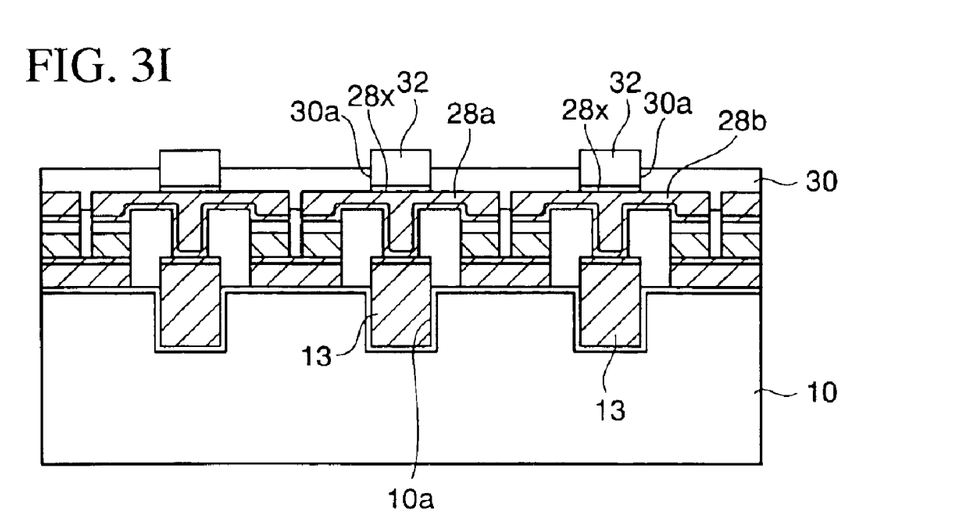

Then, as shown in FIG. 3I, a protection insulating film 30 in which an opening portion 30a is provided on a pair of electrodes 28a, 28b over the metal posts 13 respectively is formed. As the protection insulating film 30, an epoxy resin film or a polyimide resin film of 5 to 10 μm thickness, for example, may be employed.

Then, connecting portions 28x are formed by applying the Ni/Au plating to portions of a pair of electrodes 28a, 28b exposed from the opening portions 30a in the protection insulating film 30. Then, bumps 32 are formed on the connecting portions 28x. As the bump 32, solder bump, various metals plating bump, Au stud bump, or the like is employed. Although, the bumps 32 are not always mounted.

Figure 3J:
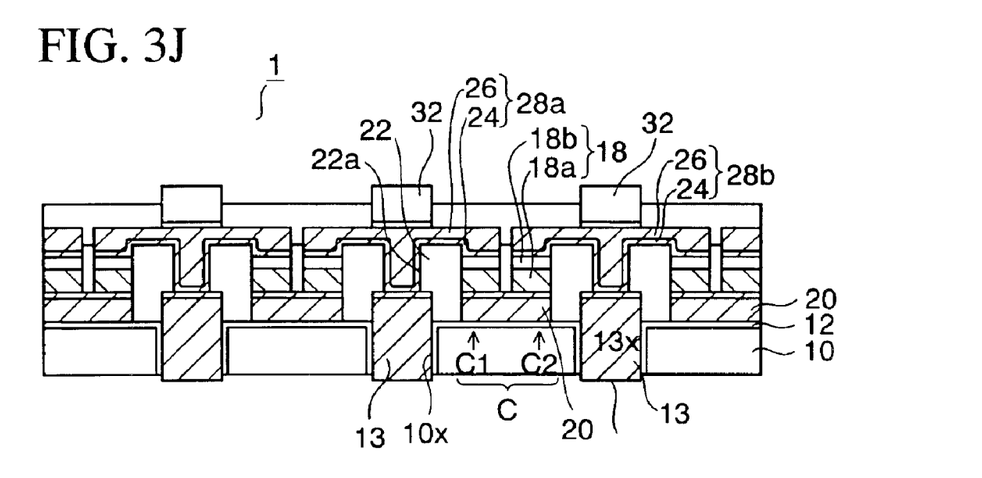

Then, as shown in FIG. 3J, lower surfaces of the metal posts 13 are exposed by grinding the silicon substrate 10 from its back surface side by means of the grinder to form connecting portions 13x. At this time, the silicon substrate 10 is thinned up to a thickness of about 50 μm, for example. Thus, the holes 10a in the silicon substrate 10 are shaped into through holes 10x, whereby the front surface side and the back surface side of the silicon substrate 10 are brought into the conductive state by the bumps 32 and the metal posts 13 that are connected mutually via the electrodes 28a, 28b.

With the above, a capacitor device 1 according to the first embodiment is completed.

In the capacitor device 1 according to the present embodiment, as shown in FIG. 3J, the float electrodes 20 are formed on the silicon substrate 10 via the silicon oxide film 12, and then the valve metal film 18a and the dielectric film 18b obtained by applying the anodic oxidation to the valve metal film 18a are formed thereon. Then, the first electrode 28a is formed in the areas overlapping with a part of the float electrode 20 on the dielectric film 18b, and the second electrode 28b is formed in the areas overlapping with another part of the float electrode 20.

In this manner, the first capacitor C1 having the structure in which the valve metal film 18a and the overlying dielectric film 18b are put between the float electrode 20 and the first electrode 28a and the second capacitor C2 having the structure in which the valve metal film 18a and the overlying dielectric film 18b are put between the float electrode 20 and the second electrode 28b are formed. Then, the first capacitor C1 and the second capacitor C2 are connected in series with each other to constitute the capacitor C according to the present embodiment.

The first and second electrodes 28a, 28b are extended to the areas overlapping with a part of adjacent another float electrode 20 respectively, whereby a plurality of capacitors C are constructed similarly. Also, the through holes 10x are provided in the portions of the silicon substrate 10 between a plurality of float electrodes 20, and the metal post 13 is filled therein respectively. The top portion of the metal post 13 is connected to the first electrode 28a or the second electrode 28b via the via hole 22a provided in the insulating film 22.

Figure 4:
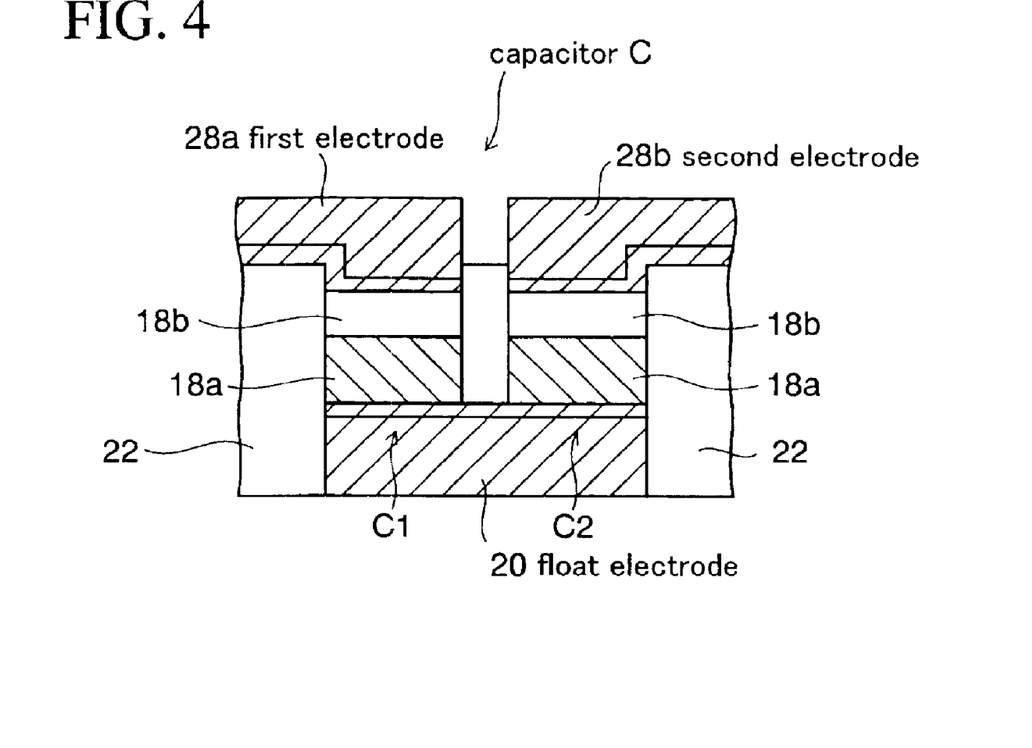
FIG. 4 is a sectional view showing a pertinent portion of the capacitor device according to the first embodiment of the present invention.
Figure 5:
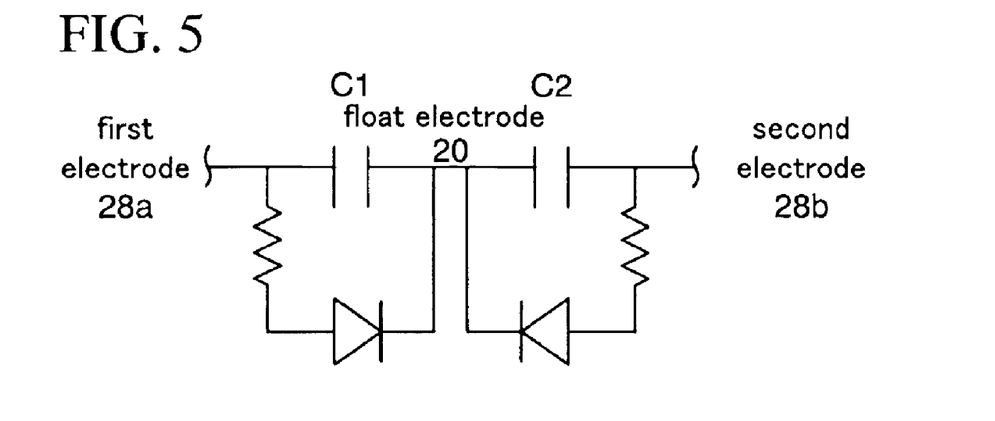
FIG. 5 is a circuit diagram showing an equivalent circuit of the capacitor in FIG. 4.

FIG. 4 is a sectional view showing a pertinent portion of the capacitor device according to the first embodiment of the present invention, and FIG. 5 is a circuit diagram showing an equivalent circuit of the capacitor in FIG. 4. As shown in FIG. 4 and FIG. 5, the capacitor C according to the present embodiment is constructed by connecting the first capacitor C1 and the second capacitor C2 in series. Then, since the dielectric film 18b obtained by applying the anodic oxidation to the valve metal film 18a is used in both the first capacitor C1 and the second capacitor C2, the good insulation characteristic is exhibited when the current is supplied from one surface side of the dielectric film 18b, nevertheless the rectifying action appears to flow the leakage current when the current is supplied from the other surface side of the dielectric film 18b.

In other words, as shown in FIG. 5, in the first capacitor C1, the electric insulation characteristic is obtained when the float electrode 20 side acts as the anode whereas the rectifying action appears to flow the leakage current when the first electrode 28a side acts as the anode. Also, in the second capacitor C2, the electric insulation characteristic is obtained similarly when the float electrode 20 side acts as the anode whereas the rectifying action appears to flow the leakage current when the second electrode 28b side acts as the anode. However, in the capacitor C according to the present embodiment, the float electrode 20 is electrically floated and either of a pair of electrodes 28a, 28b acts as the anode.

As a consequence, in the capacitor C according to the present embodiment, when the first electrode 28a acts as the anode, the current flows in the rectifying direction in the first capacitor C1 but the current flows in the direction opposite to the rectifying direction in the second capacitor C2, whereby the good electric insulation characteristic is obtained. In contrast, when the second electrode 28b acts as the anode, the current flows in the rectifying direction in the second capacitor C2 but the current flows in the direction opposite to the rectifying direction in the first capacitor C1, whereby the good electric insulation characteristic is also obtained.

In this way, in the capacitor device 1 according to the present embodiment, although the polar dielectric film 18b having the rectifying action in one direction is employed, the identical (symmetrical) electrical route can be ensured and thus the good electric insulation characteristic can be obtained even when the current is supplied from either of the first electrode 28a and the second electrode 28b.

In contrast to this, in the structure of the capacitor device in the related art, as described above, the asymmetrical structure in which the current is supplied from both surface sides of the polar dielectric film having the rectifying action in one direction is formed. Therefore, the asymmetrical electrical characteristic is derived such that the good insulation characteristic can be obtained when the lower electrode acts as the anode, nevertheless the sufficient insulation characteristic cannot be obtained when the upper electrode acts as the anode.

Also, in the capacitor C according to the present embodiment, such capacitor C is constructed by arranging a pair of electrodes symmetrically with respect to the float electrode 20 to put the dielectric film 18b between them. Therefore, unlike the related art, there is no need to form the electrode by extending unnecessarily such electrode and thus the equivalent series inductance (ESL) can be reduced.

Figure 6:
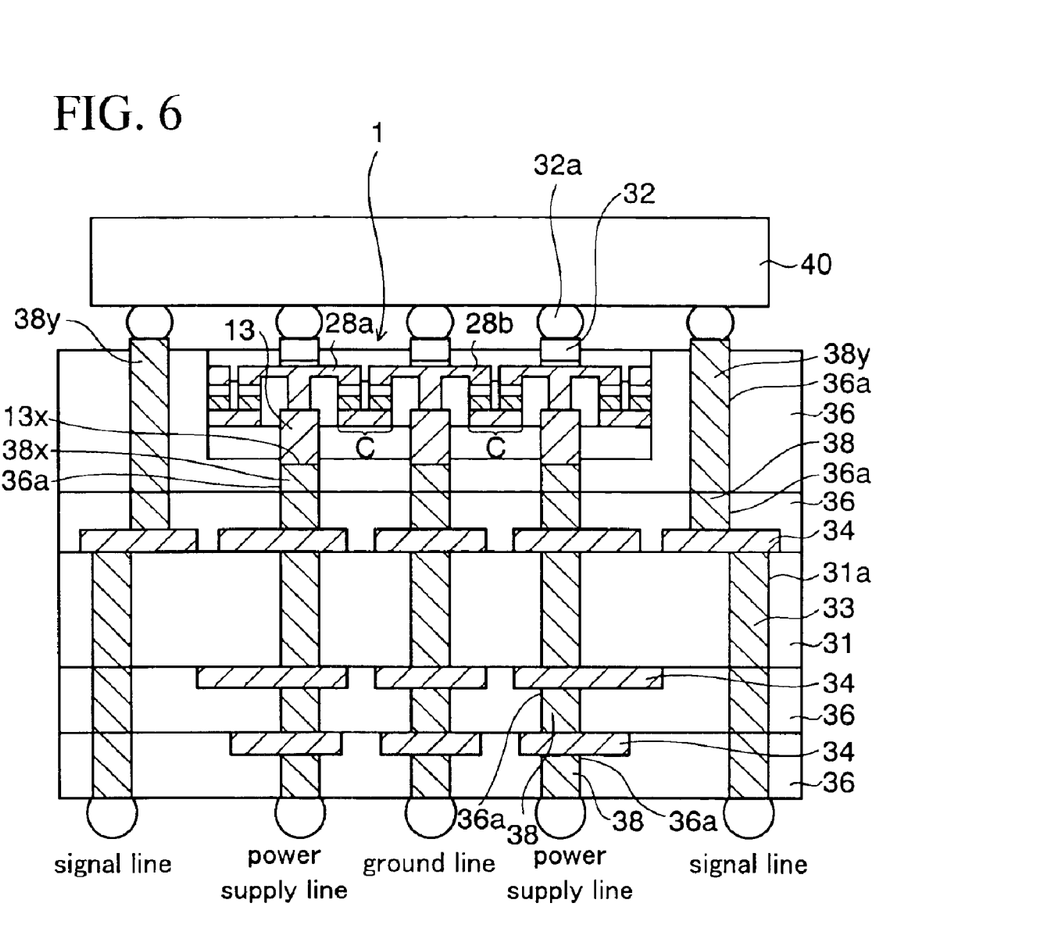
FIG. 6 is a sectional view showing a state in which a semiconductor chip is packaged on a circuit board in which the capacitor device according to the first embodiment of the present invention is built.

Next, an example of modes that the capacitor device 1 according to the present embodiment is built in the circuit substrate will be explained hereunder. FIG. 6 is a sectional view showing a state in which a semiconductor chip is packaged on the circuit board in which the capacitor device according to the embodiment of the present invention is built. The capacitor device 1 according to the present embodiment can be applied as the decoupling capacitor that is able to stabilize the power supply voltage and reduce the high-frequency noise.

As shown in FIG. 6, in the circuit substrate in which the capacitor device 1 according to the present embodiment is built, a wiring pattern 34 and an insulating film 36 are stacked alternately on both surfaces of a core substrate 31 having such a structure that a conductive body 33 is filled in through holes 31a respectively, and the wiring patterns 34 are mutually connected via via posts 38 formed in via holes 36a that are provided in the insulating film 36.

In the via holes 36a of the uppermost insulating film 36 in this circuit substrate, a connection terminal 38x connected to the power supply line and the ground line, and a connection terminal 38y connected to the signal line and also used as the via post is provided respectively. Then, the connecting portion 13x of the metal post 13 of the capacitor device 1 according to the present embodiment is connected to the connection terminal 38x of the power supply line or the ground line selectively. In such a manner, respective capacitors C of the capacitor device 1 are connected in parallel between the power supply line and the ground line of the circuit substrate.

In addition, a semiconductor chip 40 is mounted just over the capacitor device 1 built in the circuit substrate. Then, bumps 32a of the semiconductor chip 40 are connected to the bumps 32 of the power supply line and the ground line of the capacitor device 1, and also connected to the connection terminals 38y that are connected to the signal line of the circuit substrate and also used as the via post respectively.

In the semiconductor device constructed in this way, the high-frequency current (high-frequency noise) generated from the semiconductor chip 40 is removed to the ground line so as to go around the capacitors C that are arranged just under the semiconductor chip 40. Also, even though voltage variation is caused due to the switching operation of the semiconductor chip 40, the voltage variation at the power supply terminal portion of the semiconductor chip 40 can be suppressed by the action of the capacitor C.

Also, as described above, in the capacitor device 1 according to the present embodiment, it is not required to take account of the polarity, unlike the electrolytic capacitor in the related art. Therefore, the first electrode 28a may be connected to the power supply line and the second electrode 28b may be connected to the ground line, as shown in FIG. 6, otherwise conversely the first electrode 28a may be connected to the ground line and the second electrode 28b may be connected to the power supply line. In this way, a margin for design of the circuit substrate can be increased by using the capacitor device 1 according to the present embodiment.

Further, in the capacitor device 1 according to the present embodiment, unlike the related art, the unnecessary leading of the electrode is not required in respective capacitors. Therefore, since the equivalent series inductance can be reduced, the effect of suppressing the variation in the power supply voltage and reducing the high-frequency noise on the high-speed LSI can be enhanced.

Second Embodiment

FIGS. 7A to 7I are sectional views showing a method of manufacturing a capacitor device according to a second embodiment of the present invention. A difference of the second embodiment from the first embodiment resides in that a method of forming the metal post provided to pass through the substrate is different. Detailed explanation of the same steps and same elements as those in the first embodiment will be omitted herein.

Figure 7A:
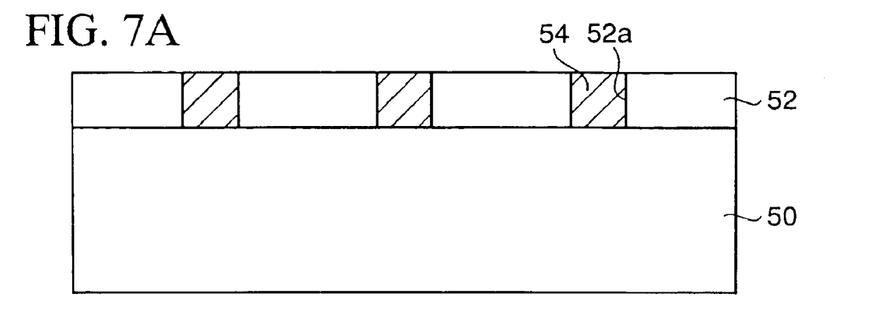
FIGS. 7A to 7I are sectional views showing a method of manufacturing a capacitor device according to a second embodiment of the present invention.
Figure 7B:
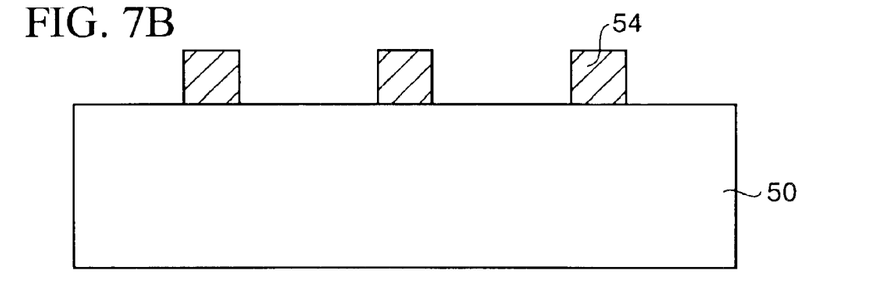

As shown sequentially in FIGS. 7A and 7B, first a metal plate 50 such as a Cu plate, an invar alloy plate made of 42-alloy, or the like, a molybdenum (Mo) plate, or the like is prepared. Then, a resist film 52 in which opening portions 52a are formed in predetermined areas is formed on the metal plate 50. Then, metal projections 54 made of Cu or the like are formed in the opening portions 52a in the resist film 52 by the electroplating, and then the resist film 52 is removed.

Figure 7C:
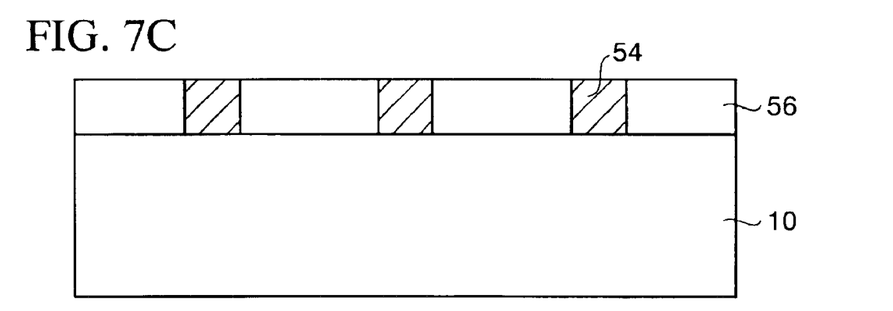

Then, a resin film 56 for covering the metal projections 54 is formed on the metal plate 50, and then this resin film 56 is polished until upper surfaces of the metal projections 54 are exposed. Thus, as shown in FIG. 7C, upper surfaces of the metal projections 54 and an upper surface of the resin film 56 are planarized to have substantially equal heights.

Figure 7D:
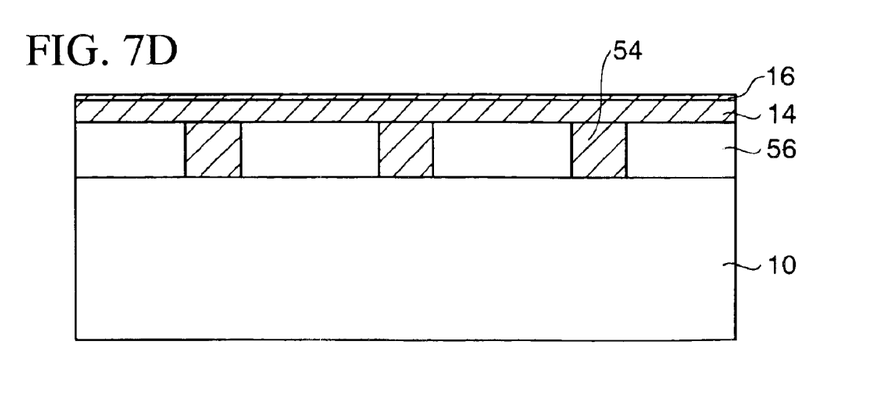
Figure 7E:
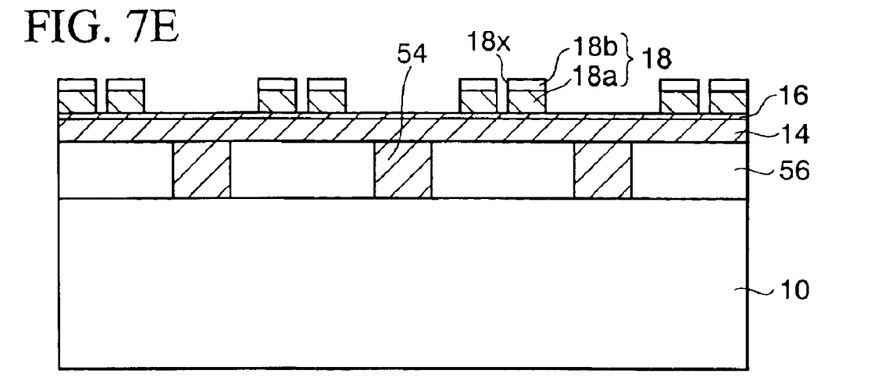

Then, as shown in FIG. 7D, the first conductive film 14 and the first intermediate layer 16 are formed sequentially on the metal projections 54 and the resin film 56, like the first embodiment, to connect electrically the metal projections 54 and the first conductive film 14. Then, as shown in FIG. 7E, the valve metal film 18a is formed by the same method as the first embodiment, and then the dielectric film 18b is obtained by applying the anodic oxidation to the valve metal film 18a. Then, the dielectric film/valve metal film patterns 18 in which the opening portion 18x is provided in the center portion respectively are formed by patterning the dielectric film 18b and the valve metal film 18a.

Figure 7F:
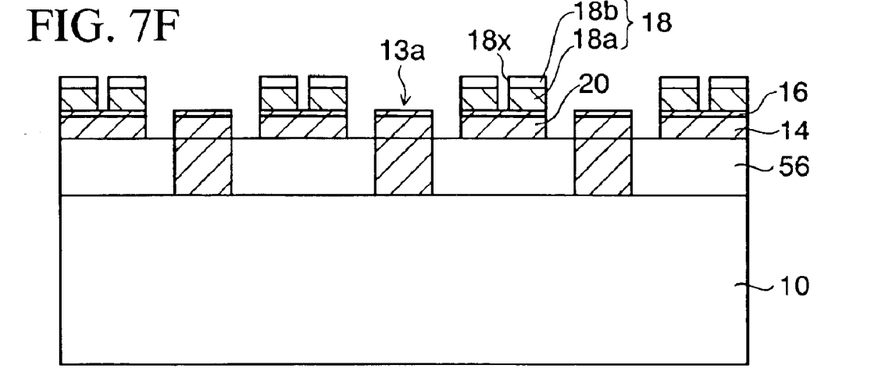

Then, as shown in FIG. 7F, like the first embodiment, the first intermediate layer 16 and the first conductive film 14 in the area between the metal projections 54 and the dielectric film/valve metal film patterns 18 are etched. Thus, the float electrode 20 is formed directly under the dielectric film/valve metal film patterns 18 respectively, and also patterns of the first intermediate layer 16 and the first conductive film 14 are laminated on the upper surfaces of the metal projections 54 to form metal posts 13a.

Figure 7G:
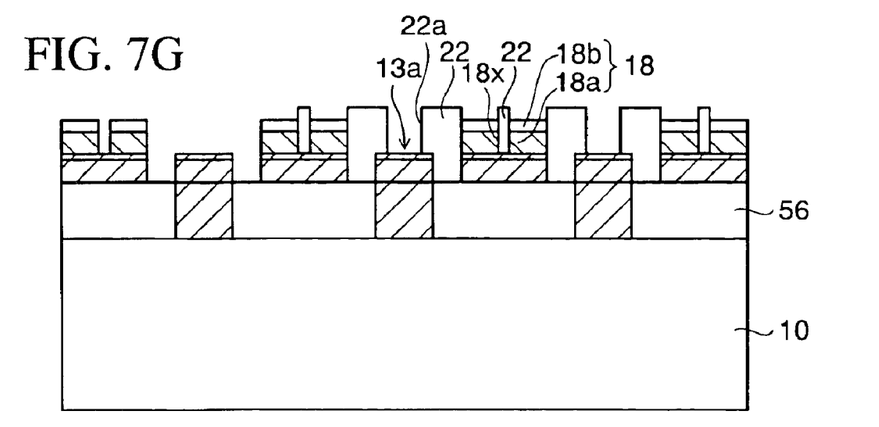

Then, as shown in FIG. 7G, like the first embodiment, the insulating film 22 is buried and formed selectively on areas between the metal posts 13a and the dielectric film/valve metal film patterns 18 and in the opening portions 18x in the dielectric film/valve metal film patterns 18. Thus, the via hole 22a is arranged on the metal posts 13 respectively.

Figure 7H:
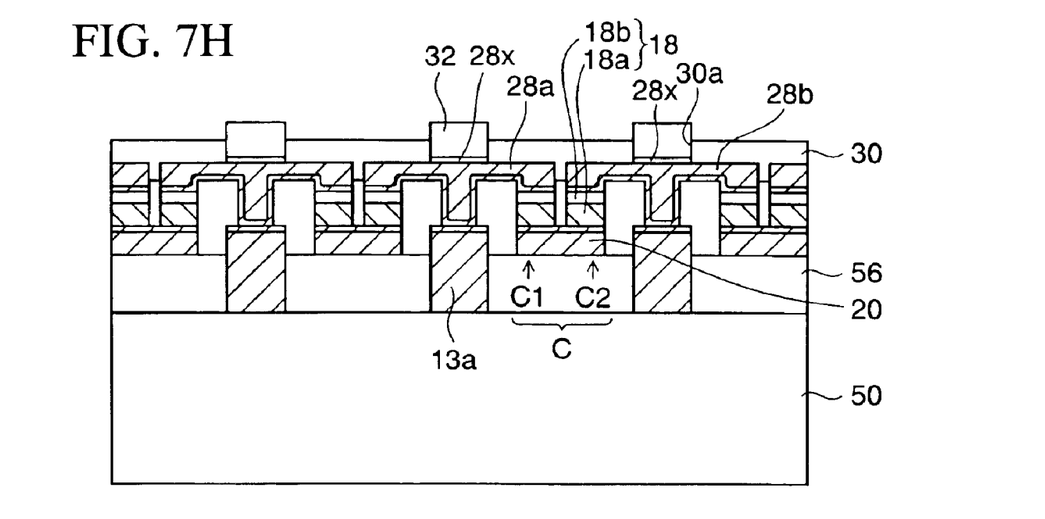

Then, as shown in FIG. 7H, like the first embodiment, a pair of electrodes 28a, 28b connected to the metal posts 13a via the via holes 22a are formed on the dielectric film 18b and the insulating film 22. Thus, the capacitor C that is constructed by connecting the first capacitor C1 and the second capacitor C2, both being composed to have the same structure as the first embodiment respectively, in series with each other is obtained.

Then, as in the first embodiment, the protection insulating film 30 in which the opening portion 30a is provided in predetermined portions of a pair of electrodes 28a, 28b respectively is formed. Then, the connecting portions 28x are formed by applying the Ni/Au plating to portions of a pair of electrodes 28a, 28b in the opening portions 30a in the protection insulating film 30. Then, the bumps 32 are formed on the connecting portions 28x.

Figure 7I:
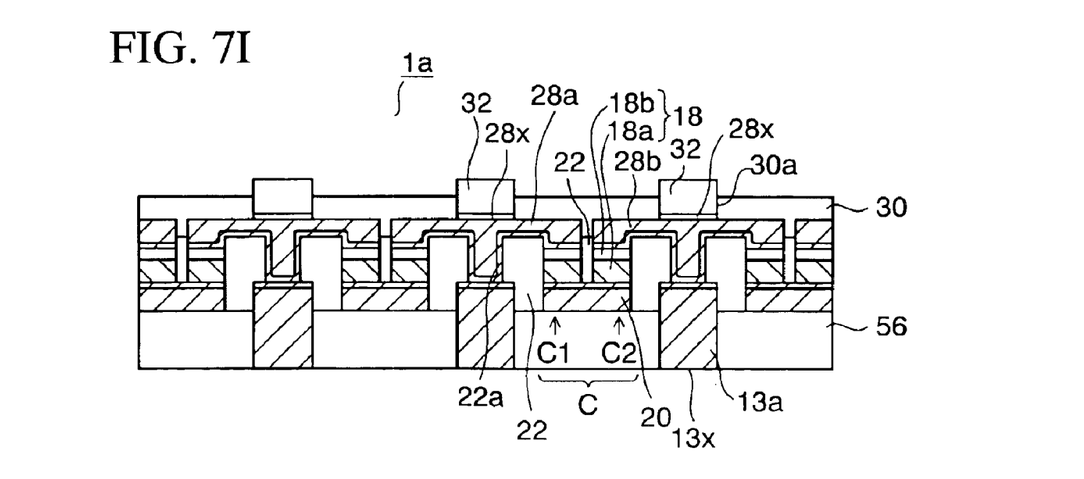

Then, as shown in FIG. 7I, the metal plate 50 is removed selectively from the resin film 56 by the wet etching. Thus, lower surfaces of the connecting portions 13x of the metal posts 13a and the resin film 56 are exposed and the resin film 56 functions as the substrate of the capacitor device. Then, the bump 32 and the metal posts 13 connected mutually via the electrodes 28a, 28b bring the front surface side and the back surface side of the resin film 56 into their mutually conductive state. With the above, a capacitor device 1a according to the second embodiment is completed.

The capacitor device 1a according to the second embodiment can be applied as the decoupling capacitor as in the first embodiment, and can achieve the advantages similar to the first embodiment.

What is claimed is:

1. A capacitor device comprising:
   a substrate;
   a float electrode formed on or over the substrate;
   a valve metal film formed on the float electrode;
   a dielectric film formed on the valve metal film by applying an anodic oxidation to a part of the valve metal film; and
   a pair of electrodes provided in areas overlapping with two different parts of the float electrode on the dielectric film respectively.

2. A capacitor device according to claim 1, wherein the pair of electrodes are arranged in a symmetrical positional relationship with respect to a center portion of the float electrode.

3. A capacitor device according to claim 1, wherein the pair of electrodes are extended to positions that overlap with one parts of other float electrodes adjacent to the float electrode respectively and are also used as one electrodes of other adjacent capacitors respectively, and further comprising:
   a through hole formed in a portion of the substrate, which corresponds to an area between a plurality of float electrodes; and
   a metal post filled in the through hole to connect conductively the pair of electrodes and a back surface side of the substrate.

4. A capacitor device according to claim 3, wherein the valve metal film and the dielectric film are formed on the float electrode as a pattern, and also the metal post is isolated from the float electrode and the valve metal film by an insulating film.

5. A capacitor device according to claim 1, wherein the valve metal film is made of tantalum, aluminum, hafnium, niobium, titanium or zirconium.

6. A capacitor device according to claim 1, wherein the substrate is made of silicon, resin, or glass.

7. A capacitor device according to claim 1, wherein an electric insulation characteristic is obtained in the capacitor device even when either of the pair of electrodes acts as an anode.

8. A capacitor device according to claim 3, wherein a connecting portion of the metal post exposed from a back surface of the substrate of the capacitor device is connected to a connecting terminal of a circuit substrate, a semiconductor chip is connected to the pair of electrodes via bumps, and each capacitor of the capacitor device is arranged between a power supply line and a ground line.

9. A capacitor device according to claim 8, wherein one electrode out of the pair of electrodes is connected to the power supply line and other electrode is connected to the ground line, or one electrode out of the pair of electrodes is connected to the ground line and other electrode is connected to the power supply line.

10. A method of manufacturing a capacitor device comprising the steps of:
    forming a first conductive film on or over a substrate;
    forming a valve metal film on the first conductive film;
    forming a dielectric film by applying an anodic oxidation to a part of the valve metal film;
    forming a dielectric film/valve metal film pattern by patterning the dielectric film and the valve metal film;
    forming a float electrode under the dielectric film/valve metal film pattern by patterning the first conductive film; and
    forming a pair of electrodes on the dielectric film/valve metal film pattern in areas overlapping with two different parts of the float electrode respectively.

11. A method of manufacturing a capacitor device according to claim 10, wherein the substrate includes a hole in a predetermined portion in which the float electrode is not formed, and the step of forming the first conductive film includes filling the first conductive film in a hole in the substrate,
    the step of forming the float electrode is the step of forming simultaneously the float electrode and the metal post filled in the hole, by etching an area between a portion of the first conductive film, which is filled on the hole, and a portion located under the dielectric film/valve metal film pattern,
    further comprising the step of forming selectively an insulating film on an area between the metal post and the float electrode to arrange a via hole on the metal post after the step of forming the float electrode but before the step of forming the pair of electrodes,
    wherein the step of forming the pair of electrodes contains the step of connecting electrically the pair of electrodes to the metal post via the via hole respectively, and
    further comprising the step of thinning the substrate from a back surface side to expose a lower portion of the metal post after the step of forming the pair of electrodes.

12. A method of manufacturing a capacitor device according to claim 10, wherein the substrate includes a metal plate, a metal projection formed on the metal plate, and a resin film formed by planarizing the metal projection in a state that an upper surface of the metal projection is exposed, and the step of forming the first conductive film is the step of connecting the first conductive film to the metal projection, and
    the step of forming the float electrode is the step of forming simultaneously the float electrode and the metal post that is formed by laminating the first conductive film on the metal projection, by etching an area between a portion, which is positioned on the metal projection, out of the first conductive film and a portion under the dielectric film/valve metal film pattern,
    further comprising the step of forming selectively an insulating film on an area between the metal post and the float electrode to arrange a via hole on the metal post after the step of forming the float electrode but before the step of forming the pair of electrodes,
    wherein the step of forming the pair of electrodes includes connecting electrically the pair of electrodes to the metal post via the via hole respectively, and
    further comprising the step of removing selectively the metal plate from the resin film to expose a lower portion of the metal post after the step of forming the pair of electrodes.

13. A method of manufacturing a capacitor device according to claim 10, wherein the valve metal film is made of tantalum, aluminum, hafnium, niobium, titanium or zirconium.

14. A method of manufacturing a capacitor device according to claim 11, wherein the substrate is made of silicon, resin, or glass.

* * * * *